(12) United States Patent
Lee et al.

(10) Patent No.: US 11,906,442 B2
(45) Date of Patent: Feb. 20, 2024

(54) FOREIGN MATERIAL INSPECTION SYSTEM OF DISPLAY UNIT

(71) Applicant: LG CHEM, LTD., Seoul (KR)

(72) Inventors: Beom Seok Lee, Daejeon (KR); Chan Soo Kim, Daejeon (KR); Eung Jin Jang, Daejeon (KR); Sung Hyun Baek, Daejeon (KR); Yu Jin Lim, Daejeon (KR)

(73) Assignee: LG CHEM, LTD, Seoul (KR)

( * ) Notice: Subject to any disclaimer, the term of this patent is extended or adjusted under 35 U.S.C. 154(b) by 488 days.

(21) Appl. No.: 17/252,567

(22) PCT Filed: Jun. 21, 2019

(86) PCT No.: PCT/KR2019/007473
§ 371 (c)(1),
(2) Date: Dec. 15, 2020

(87) PCT Pub. No.: WO2019/245313
PCT Pub. Date: Dec. 26, 2019

(65) Prior Publication Data
US 2021/0255115 A1 Aug. 19, 2021

(30) Foreign Application Priority Data

Jun. 22, 2018 (KR) .................. 10-2018-0072249

(51) Int. Cl.
*G01N 21/94* (2006.01)
*G01N 21/55* (2014.01)
(Continued)

(52) U.S. Cl.
CPC ............. *G01N 21/94* (2013.01); *G01N 21/55* (2013.01); *G01N 21/95* (2013.01); *H10K 71/00* (2023.02);
(Continued)

(58) Field of Classification Search
CPC ........ G01N 21/94; G01N 24/55; G01N 21/95; H10K 71/00; H10K 71/70; G02B 5/3025; G02B 5/3083
See application file for complete search history.

(56) References Cited

U.S. PATENT DOCUMENTS 7,372,062 B2 * 5/2008 Tanaka ............... G01N 21/4788
250/559.44
7,738,102 B2 * 6/2010 Kobayashi ........... G01N 21/958
356/389

(Continued)

FOREIGN PATENT DOCUMENTS

JP         2007213016 A    8/2007
KR    10-2006-0094765 A    8/2006
(Continued)

*Primary Examiner* — Tri T Ton
*Assistant Examiner* — Jarreas Underwood
(74) *Attorney, Agent, or Firm* — BRYAN CAVE LEIGHTON PAISNER LLP

(57) ABSTRACT

An exemplary embodiment of the present invention provides a foreign substance inspection system for a display unit, including: a lighting unit configured to provide incident light to a display unit having an organic light emitting display panel; and a foreign substance detecting unit configured to receive incident light that is reflected by the display unit and detect whether a foreign substance is introduced into the display unit.

4 Claims, 4 Drawing Sheets

(51) Int. Cl.
- *G01N 21/95* (2006.01)
- *H10K 71/00* (2023.01)
- *H10K 71/70* (2023.01)
- *G02B 5/30* (2006.01)

(52) U.S. Cl.
CPC ........... *H10K 71/70* (2023.02); *G02B 5/3025* (2013.01); *G02B 5/3083* (2013.01)

(56) References Cited

U.S. PATENT DOCUMENTS

| | | | | |
|---|---|---|---|---|
| 8,709,181 B2* | 4/2014 | Kitada | ............... | B32B 38/04 |
| | | | | 156/64 |
| 9,835,565 B2* | 12/2017 | Kim | ............... | G01N 21/95 |
| 2007/0046931 A1* | 3/2007 | Oomori | ............ | G01N 21/9501 |
| | | | | 356/237.2 |
| 2007/0273865 A1* | 11/2007 | Niitsu | ............... | G01L 5/0047 |
| | | | | 356/33 |
| 2010/0033191 A1* | 2/2010 | Lee | ............... | G01R 31/001 |
| | | | | 324/555 |
| 2014/0133025 A1* | 5/2014 | Lee | ............... | G02B 30/27 |
| | | | | 359/465 |
| 2016/0187262 A1* | 6/2016 | Kim | ............... | G01N 21/95 |
| | | | | 356/237.2 |
| 2017/0236266 A1* | 8/2017 | Rostami | ............ | H04N 23/56 |
| | | | | 348/131 |
| 2019/0196174 A1* | 6/2019 | Park | ............... | G02B 5/3025 |

FOREIGN PATENT DOCUMENTS

| | | |
|---|---|---|
| KR | 1020130060090 A | 6/2013 |
| KR | 20-2014-0001508 U | 3/2014 |
| KR | 10-20140075171 A | 6/2014 |
| KR | 10-20160082787 A | 7/2016 |
| KR | 10-20160131647 A | 11/2016 |
| KR | 10-20170071019 A | 6/2017 |
| KR | 10-20170114514 A | 10/2017 |
| KR | 10-2018-0011921 A | 2/2018 |

* cited by examiner

[Figure 1]
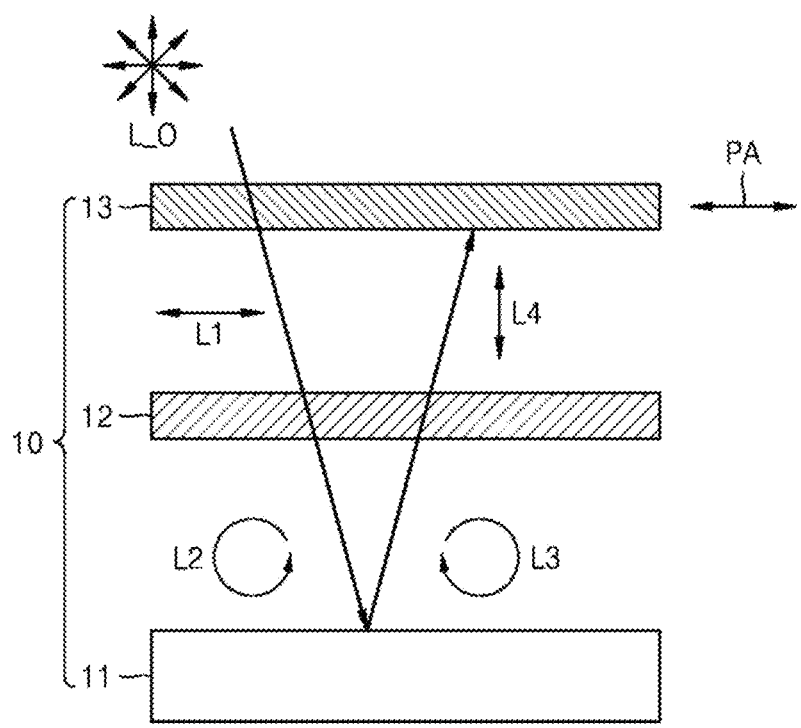

[Figure 2]
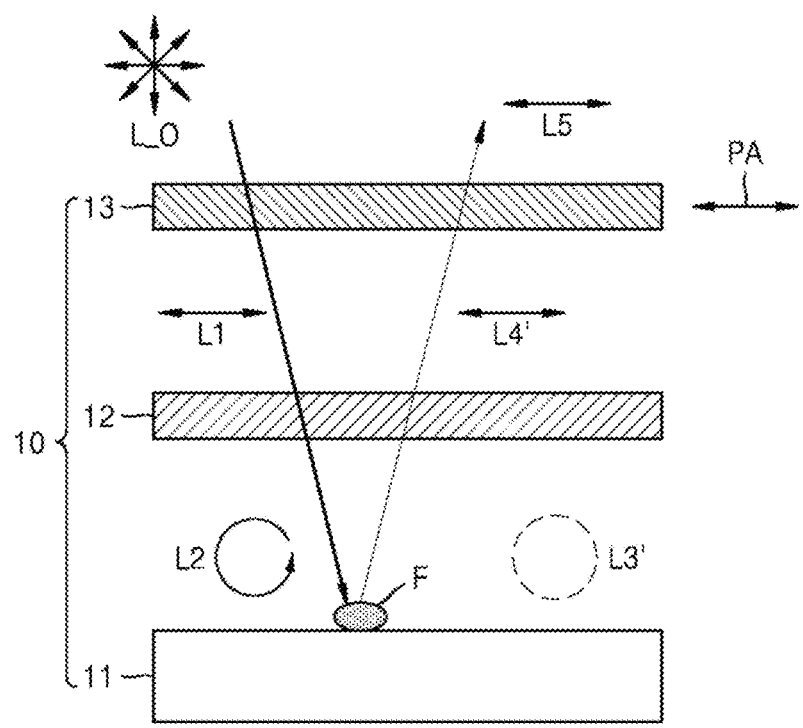

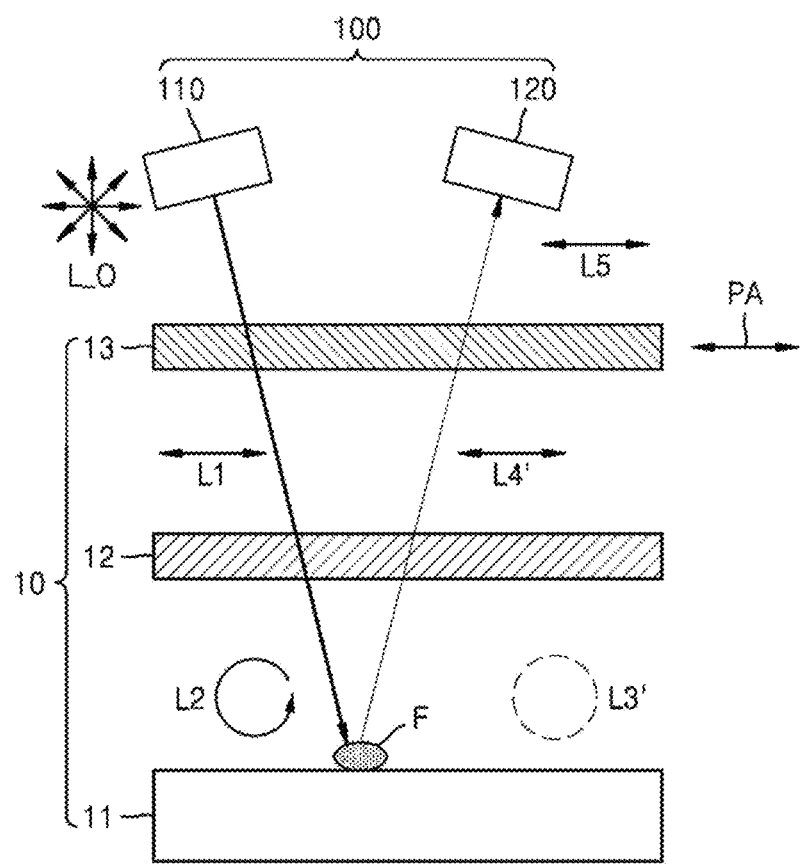
[Figure 3]

[Figure 4]
| | MICROSCOPIC IMAGE | RAW IMAGE | PROCESSING IMAGE |
|---|---|---|---|
| ABOUT 2,700 μm | 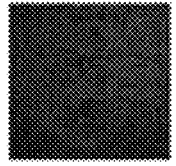 | 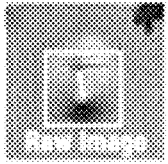 | 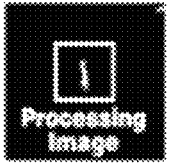 |
| ABOUT 1,200 μm | 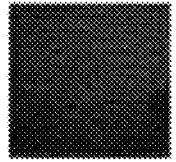 | 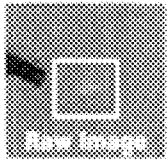 | 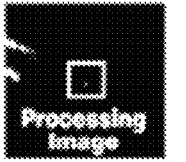 |
| ABOUT 1,500 μm | 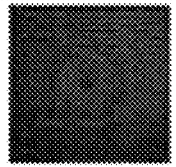 | 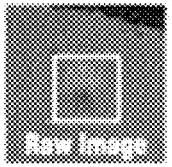 | 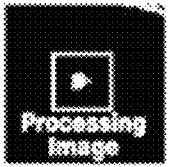 |
| ABOUT 900 μm | 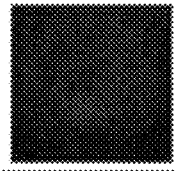 | 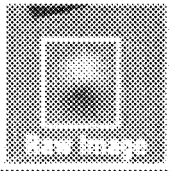 | 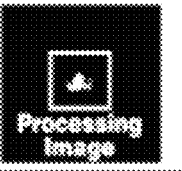 |
| ABOUT 700 μm | 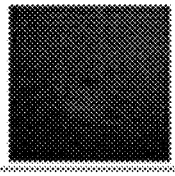 | 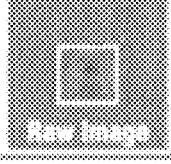 | 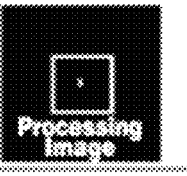 |
| ABOUT 300 μm | 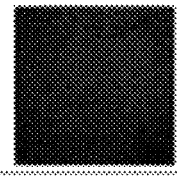 | 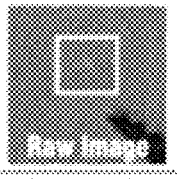 | 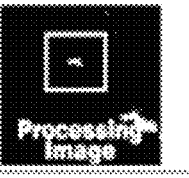 |
| ABOUT 500 μm | 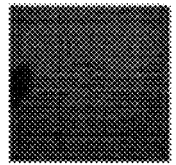 | 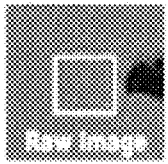 | 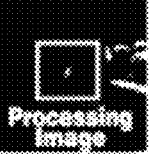 |
| ABOUT 450 μm | 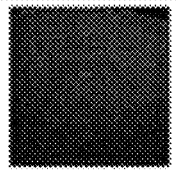 | 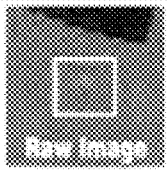 | 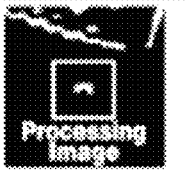 |

FOREIGN MATERIAL INSPECTION SYSTEM OF DISPLAY UNIT

FOREIGN MATERIAL INSPECTION SYSTEM OF DISPLAY UNIT

The present application is a National Phase entry pursuant to 35 U.S.C. § 371 of International Application No. PCT/KR2019/007473 filed on Jun. 21, 2019 and claims priority to and the benefit of Korean Patent Application No. 10-2018-0072249 filed with the Korean Intellectual Property Office on Jun. 22, 2018, the disclosures of which are incorporated herein by reference in their entity.

FIELD

The present invention relates to a foreign substance inspection system for a display unit which inspects whether a foreign substance is introduced into the display unit.

BACKGROUND

A display unit may be manufactured by attaching a film to a display panel. Foreign substances such as bubbles and dust are sometimes introduced between the film and the panel during the process of manufacturing the display unit.

Because the introduced foreign substances form a defective region on an image displayed from the display unit, it is necessary to categorize the display unit with the introduced foreign substances as a defective product before the display unit is released.

At present, the most common display unit is a liquid crystal display unit in which films are attached to both surfaces of a liquid crystal panel so that transmission axes of the films are perpendicular to the surfaces of the liquid crystal panel.

In the liquid crystal display unit, when light is incident on one surface of the liquid crystal display unit, the light may travel toward the other surface of the liquid crystal display unit and be transmitted. At this time, the light scatters if a foreign substance is introduced between the film and the liquid crystal panel.

Therefore, to inspect whether a foreign substance is introduced into the liquid crystal display unit, light is incident on one surface of the liquid crystal display unit, and then whether a foreign substance is introduced may be determined depending on whether the light transmitted by traveling toward the other surface scatters.

However, in the case of an organic light emitting display unit which is gradually and increasingly used, it is difficult to use a light transmission optical system capable of inspecting whether a foreign substance is introduced into a liquid crystal display.

The reason is that in the case of an organic light emitting display panel of the organic light emitting display unit, an opaque substrate is disposed at one side of an organic light emitting layer and a substrate, which is transparent to a visible side, is disposed at the other side of the organic light emitting layer, unlike a liquid crystal display panel in which transparent substrates are disposed at both sides of a liquid crystal layer.

Accordingly, there is a need for another type of foreign substance inspection device instead of the light transmission optical system because it is difficult to transmit light from one side to the other side of the organic light emitting display unit.

SUMMARY

Exemplary embodiments of the present invention have been made in an effort to provide a system capable of inspecting whether a foreign substance is introduced into an organic light emitting display unit without using a light transmission optical system.

An exemplary embodiment of the present invention provides a foreign substance inspection system for a display unit, including: a lighting unit configured to provide incident light to a display unit having an organic light emitting display panel; and a foreign substance detecting unit configured to receive incident light that is reflected by the display unit, and detect whether a foreign substance is introduced into the display unit In the present exemplary embodiment, the display unit may include a quarter-wave plate (QWP) disposed on the organic light emitting display panel, and a polarizing plate disposed on the quarter-wave plate.

In the present exemplary embodiment, the foreign substance detecting unit may determine that a foreign substance is introduced into the display unit when the foreign substance detecting unit determines that the reflected light is provided.

In the present exemplary embodiment, the lighting unit may provide the incident light having an inclined incident angle smaller than 90° to the display unit.

In the present exemplary embodiment, the foreign substance detecting unit may include an image capturing unit configured to receive the reflected light and capture an image of the display unit, and a control unit configured to receive the image of the display unit from the image capturing unit and detect whether a foreign substance is introduced into the display unit.

According to the exemplary embodiment of the present invention, it is possible to inspect whether a foreign substance is introduced into an organic light emitting display unit, without using a light transmission optical system.

BRIEF DESCRIPTION OF THE DRAWINGS

FIG. 1 is a schematic illustration of a structure of a display unit and a traveling path of external light according to an exemplary embodiment of the present invention.

FIG. 2 is a schematic illustration of a traveling path of external light when a foreign substance is introduced into the display unit according to the exemplary embodiment of the present invention.

FIG. 3 is a schematic illustration of a configuration of a foreign substance inspection system for a display unit according to the exemplary embodiment of the present invention.

FIG. 4 is collection of results of detecting foreign substances having various sizes, introduced into display units, by using the foreign substance inspection system for a display unit according to the exemplary embodiment of the present invention.

<Explanation of Reference Numerals and Symbols>

10: Display unit

11: Organic light emitting display panel

12: Quarter-wave plate

13: Polarizing plate
100: Foreign substance inspection system for display unit
110: Lighting unit
120: Foreign substance inspection unit

DETAILED DESCRIPTION

The present invention will be apparent with reference to exemplary embodiments to be described below in detail together with the accompanying drawings. However, the present invention is not limited to the exemplary embodiments disclosed herein but will be implemented in various forms. The exemplary embodiments of the present invention are provided so that the present invention is completely disclosed, and a person with ordinary skill in the art can fully understand the scope of the present invention. The present invention will be defined only by the scope of the appended claims. Meanwhile, the terms used in the present specification are for explaining the exemplary embodiments, not for limiting the present invention. Unless particularly stated otherwise in the present specification, a singular form also includes a plural form. The terms such as "comprises (includes)" and/or "comprising (including)" used in the specification do not exclude presence or addition of one or more other constituent elements, steps, operations, and/or elements, in addition to the mentioned constituent elements, steps, operations, and/or elements. The terms such as "first" and "second" may be used to describe various constituent elements, but the constituent elements should not be limited by the terms. These terms are used only to distinguish one constituent element from another constituent element.

FIG. 1 is a schematic view schematically illustrating a structure of a display unit and a traveling path of external light according to an exemplary embodiment of the present invention, and FIG. 2 is a schematic view schematically illustrating a traveling path of external light when a foreign substance is introduced into the display unit according to the exemplary embodiment of the present invention.

Referring to FIG. 1, a display unit 10 according to an exemplary embodiment of the present invention may have an organic light emitting display panel 11. The display unit 10 may include a quarter-wave plate (QWP) 12 disposed on the organic light emitting display panel 11, and a polarizing plate 13 disposed on the quarter-wave plate 12, to prevent external light L_O incident from the outside from being reflected and visually recognized from the outside.

The quarter-wave plate 12 may include an optically anisotropic thin plate manufactured such that a difference in optical path of $\lambda/4$ occurs between two polarized components that vibrate perpendicularly to transmitted light having a wavelength of $\lambda$. The light transmitted through the quarter-wave plate 12 becomes circularly polarized light when linearly polarized light is perpendicularly incident so that a direction in which light vibrates in the quarter-wave plate 12 has an angle of 90 degrees with respect to a direction in which the incident light vibrates. On the contrary, the light transmitted through the quarter-wave plate 12 becomes linearly polarized light when circularly polarized light is incident.

The polarizing plate 13 includes, as a polarizer, a polyvinyl alcohol (PVA) film which extends in a predetermined direction and is dyed with a dichroic dye. The polarizer may have a transmission axis in a predetermined direction (a transmission axis direction is denoted by 'PA' in the drawings) as the polarizer extends, and the polarizer transmits only the light that vibrates in a direction identical to the transmission axis direction.

Meanwhile, the display unit 10 may have a structure in which the organic light emitting display panel 11, the polarizing plate 13, and the quarter-wave plate 12 are stacked to be in close contact with one another. However, FIG. 1 illustrates that the respective parts are separated from one another to describe a traveling path of light.

The external light L_O to be incident on the display unit 10 may have mixed light beams that vibrate in all directions perpendicular to a traveling direction of the external light L_O.

When the external light L_O is incident on the polarizing plate 13, the polarizing plate 13 transmits only the light that vibrates in the direction identical to the transmission axis direction PA of the polarizing plate 13, that is, the polarizing plate 13 transmits first linearly polarized light L1.

The first linearly polarized light L1 transmitted through the polarizing plate 13 is incident on the quarter-wave plate 12. As illustrated in FIG. 1, when the first linearly polarized light L1 is incident on the quarter-wave plate 12, first circularly polarized light L2 is made and transmitted through the quarter-wave plate 12. The first circularly polarized light L2 may be right circularly polarized light or left circularly polarized light, and FIG. 1 illustrates the left circularly polarized light.

The first circularly polarized light L2 transmitted through the quarter-wave plate 12 is incident on the organic light emitting display panel 11. As illustrated in FIG. 1, when the first circularly polarized light L2 is incident on the organic light emitting display panel 11, the first circularly polarized light L2 is reflected by a surface of the organic light emitting display panel 11, such that second circularly polarized light L3 is made in a direction opposite to the direction of the incident first circularly polarized light L2. FIG. 1 illustrates that since the left circularly polarized light is incident on the surface of the organic light emitting display panel 11 and reflected, the second circularly polarized light L3 made by the reflection is the right circularly polarized light.

The second circularly polarized light L3 reflected by the surface of the organic light emitting display panel 11 is incident on the quarter-wave plate 12. As illustrated in FIG. 1, when the second circularly polarized light L3 is incident on the quarter-wave plate 12, second linearly polarized light L4 is made and transmitted through the quarter-wave plate 12.

The second linearly polarized light L4 vibrates in a direction perpendicular to the transmission axis direction PA of the polarizing plate 13 (identical to the vibration direction of the first linearly polarized light L1). When the second linearly polarized light L4 is incident on the polarizing plate 13, the second linearly polarized light L4 vibrates in the direction perpendicular to the transmission axis direction PA of the polarizing plate 13, and as a result, the second linearly polarized light L4 cannot be transmitted through the polarizing plate 13 and is absorbed into the polarizing plate 13.

A traveling path of external light when a foreign substance F is introduced between the organic light emitting display panel 11 and the quarter-wave plate 12 will be described with reference to FIG. 2.

Because the processes in which the external light L_O is incident and transmitted through the polarizing plate 13 and the quarter-wave plate 12 are identical to the above-mentioned processes, the description will focus on the processes after the light is transmitted through the quarter-wave plate 12.

The first circularly polarized light L2 transmitted through the quarter-wave plate 12 is incident on the organic light emitting display panel 11. However, because the foreign substance F is introduced, the first circularly polarized light L2 reaches the foreign substance F, as illustrated in FIG. 2. The first circularly polarized light L2, which reaches the foreign substance F, is reflected by the foreign substance F, but because the foreign substance F does not have a flat surface unlike the surface of the organic light emitting display panel 11, the reflected light is not completely opposite to the first circularly polarized light L2, but second incompletely circularly polarized light L3' is made, as illustrated in FIG. 2.

The second incompletely circularly polarized light L3' reflected by the foreign substance F is incident on the quarter-wave plate 12. As illustrated in FIG. 2, when the second incompletely circularly polarized light L3' is incident on the quarter-wave plate 12, second linearly polarized light L4' is made and transmitted through the quarter-wave plate 12.

However, the second linearly polarized light L4' is not completely opposite to the first circularly polarized light L2, but the second linearly polarized light L4' is made as the light is polarized through the quarter-wave plate 12 based on the second incompletely circularly polarized light L3'. As a result, the second linearly polarized light L4' vibrates in a direction different from the vibration direction of the second linearly polarized light L4 which is made when no foreign substance is introduced. Specifically, the second linearly polarized light L4' may vibrate in the direction which is not perpendicular to the transmission axis direction PA of the polarizing plate 13 (identical to the vibration direction of the first linearly polarized light L1). When the second linearly polarized light L4' is incident on the polarizing plate 13, the second linearly polarized light L4' is transmitted through the polarizing plate 13 because the second linearly polarized light L4' vibrates in the direction which is not perpendicular to the transmission axis direction PA of the polarizing plate 13. Transmitted light L5 transmitted through the polarizing plate 13 may be visually recognized from the outside.

FIG. 3 is a schematic view schematically illustrating a configuration of a foreign substance inspection system for a display unit according to the exemplary embodiment of the present invention.

Referring to FIG. 3, a foreign substance inspection system 100 (hereinafter, also simply referred to as the 'system') for a display unit according to the exemplary embodiment of the present invention may include a lighting unit 110 and a foreign substance detecting unit 120.

The lighting unit 110 may provide incident light L_O to the display unit 10 having the organic light emitting display panel 11. The lighting unit 110 may include a light source for providing incident external light. The lighting unit 110 may provide the incident external light L_O having an inclined incident angle smaller than 90° to the display unit 10. Because an image capturing device of the foreign substance detecting unit 120, which will be described below, needs to capture an image of light reflected by the display unit 10, the lighting unit 110 needs to be disposed at one side of the display unit 10. In this case, it is advantageous to make the incident angle of the incident light smaller than 90° to the display unit 10 in order to minimize an optical interference between the incident light and the reflected light.

The foreign substance detecting unit 120 may receive the reflected light L5, which is provided as the incident external light L_O is reflected by the display unit 10, and detect whether a foreign substance is introduced into the display unit. The foreign substance detecting unit 120 may include an image capturing unit configured to capture an image of the display unit, and a control unit configured to receive the image of the display unit from the image capturing unit and detect whether a foreign substance is introduced into the display unit.

When no foreign substance is introduced into the display unit 10, the image capturing unit captures an image without receiving separate reflected light from the display unit 10, and an entire surface of the image of the display unit has no region in which contrast levels are clearly distinguished. In this case, the control unit may determine that no foreign substance is introduced into the display unit.

When a foreign substance is introduced into the display unit 10, the image capturing unit captures an image while receiving reflected light from the display unit 10, and the captured and acquired image of the display unit may have an entire surface including a bright region made by the received reflected light and a dark region in which no reflected light is provided. Therefore, because the image of the display unit has a region in which the contrast levels are clearly distinguished, the control unit may determine that a foreign substance is introduced into the display unit. In particular, the control unit may determine that the foreign substance is introduced into a region corresponding to the bright captured region.

Specifically, when no foreign substance F is introduced into the display unit 10, the light travels in the order of the polarizing plate 13, the quarter-wave plate 12, the organic light emitting display panel 11, and the quarter-wave plate 12 even though the external light L_O is incident, as illustrated in FIG. 1. However, because the second linearly polarized light L4 cannot be transmitted through the polarizing plate 13, the image capturing unit captures an image of the display unit 10 without receiving the reflected light from the display unit Further, when the foreign substance F is introduced into the display unit 10, as illustrated in FIG. 2, the external light L_O may be incident and may travel in the order of the polarizing plate 13, the quarter-wave plate 12, the foreign substance F, the quarter-wave plate 12, and the outside, and the reflected light L5 may reach the image capturing unit, and as a result, the image capturing unit captures an image of the display unit 10 while receiving the reflected light L5 from the display unit 10.

FIG. 4 is a view illustrating a result of detecting foreign substances having various sizes, introduced into display units, by using the foreign substance inspection system for a display unit according to the exemplary embodiment of the present invention.

Specifically, incident light having an inclined incident angle smaller than 90° was provided to display units with introduced foreign substances having various sizes between 450 μm and 2,700 μm, and then images of the display units were captured. Further, FIG. 4 illustrates captured and acquired raw images, and processing images which are made by converting the raw images into black-and-white images to increase contrast levels.

It was ascertained that regions, in which foreign substances were present and which were recognized by a microscope, had clearly distinguished contrast levels in both the regions corresponding to the raw images and the regions corresponding to the processing images. Accordingly, it can be ascertained that whether a foreign substance is introduced may be detected by actually using the system according to the exemplary embodiment of the present invention without using a microscope or the like during the process.

According to the exemplary embodiment of the present invention, it is possible to inspect whether a foreign substance is introduced into an organic light emitting display unit, without using a light transmission optical system.

Furthermore, according to the exemplary embodiment of the present invention, whether a foreign substance is introduced may be easily inspected by using a reflective optical system even though the organic light emitting display unit 10 has the structure including the quarter-wave plate 12 and the polarizing plate 13 that prevent the incident external light from being reflected.

While the present invention has been described with reference to the aforementioned exemplary embodiments, various modifications or alterations may be made without departing from the subject matter and the scope of the invention. Accordingly, the appended claims include the modifications or alterations as long as the modifications or alterations fall within the subject matter of the present invention.

The invention claimed is:

1. A foreign substance inspection system comprising:
   a light source configured to provide incident light to a display, the display having an organic light emitting display panel, a quarter-wave plate disposed on the organic light emitting display panel, and a polarizing plate disposed on the quarter-wave plate; and
   a foreign substance detector configured to receive incident light that is reflected by the display, and detect whether a foreign substance is introduced into the display,
   wherein the foreign substance detector determines that a foreign substance is introduced into the display when the foreign substance detector determines that the reflected light is provided.

2. The foreign substance inspection system of claim 1, wherein the light source provides the incident light having an inclined incident angle smaller than 90° to the display.

3. The foreign substance inspection system of claim 1, wherein the foreign substance detector includes an image capturing device configured to capture an image of the display, and a controller configured to receive the image of the display from the image capturing device and detect whether a foreign substance is introduced into the display.

4. The foreign substance inspection system of claim 1, wherein the quarter-wave plate and the polarizing plate are configured such that when no foreign substance is present on the display, light reflected from the display is not transmitted through the polarizing plate and the reflected light is not received by the detector.

* * * * *